US010141627B2

(12) United States Patent
Ritter et al.

(10) Patent No.: US 10,141,627 B2
(45) Date of Patent: Nov. 27, 2018

(54) COMPACT WIRELESS ANTENNAE MOUNTING WITH ELECTROSTATIC DISCHARGE PROTECTION (71) Applicant: THOMSON LICENSING, Issy-les-Moulineaux (FR)

(72) Inventors: Darin Bradley Ritter, Indianapolis, IN (US); Mickey Jay Hunt, Camby, IN (US); William P. Dernier, Indianapolis, IN (US)

(73) Assignee: Interdigital CE Patent Holdings, Paris (FR)

( * ) Notice: Subject to any disclaimer, the term of this patent is extended or adjusted under 35 U.S.C. 154(b) by 0 days.

(21) Appl. No.: 15/031,729

(22) PCT Filed: Oct. 22, 2014

(86) PCT No.: PCT/US2014/061692
§ 371 (c)(1),
(2) Date: Apr. 23, 2016

(87) PCT Pub. No.: WO2015/061396
PCT Pub. Date: Apr. 30, 2015

(65) Prior Publication Data
US 2016/0248145 A1  Aug. 25, 2016

Related U.S. Application Data (60) Provisional application No. 61/894,985, filed on Oct. 24, 2013, provisional application No. 62/009,538, filed on Jun. 9, 2014.

(51) Int. Cl.
*H01Q 1/22* (2006.01)
*H01Q 21/06* (2006.01)
(Continued)

(52) U.S. Cl.
CPC ............ *H01Q 1/22* (2013.01); *H01Q 1/002* (2013.01); *H01Q 1/02* (2013.01); *H01Q 1/243* (2013.01);
(Continued)

(58) Field of Classification Search
CPC .................................................. H05K 9/0067
See application file for complete search history.

(56) References Cited

U.S. PATENT DOCUMENTS 6,054,955 A * 4/2000 Schlegel, Jr. ............ H01Q 9/42
343/702
8,049,626 B2  11/2011 Sakama et al.
(Continued)

FOREIGN PATENT DOCUMENTS

GB        2345208      6/2000
WO      WO199506338    3/1995
WO      WO2009029520   3/2009

*Primary Examiner* — Robert Karascony
(74) *Attorney, Agent, or Firm* — Richard LaPeruta; Jerome G. Schaefer (57) ABSTRACT A set top box comprises multiple antennae (15) are positioned outside the periphery of the printed circuit board (5). The antennae can be vertically oriented (15V) or horizontally oriented (15H). The antennae (15) are maintained at least 20 mm from a heatsink (6) and the printed circuit board (5) to prevent electrostatic discharge. The set top box includes vents (14) in the bottom frame (2) outside the periphery of the printed circuit board (5) to promote heat dissipation.

12 Claims, 9 Drawing Sheets (51) Int. Cl.
　　　*H01Q 1/00*　　　　(2006.01)
　　　*H01Q 21/00*　　　(2006.01)
　　　*H05K 9/00*　　　　(2006.01)
　　　*H01Q 21/28*　　　(2006.01)
　　　*H01Q 1/24*　　　　(2006.01)
　　　*H01Q 1/02*　　　　(2006.01)
　　　*H04N 5/64*　　　　(2006.01)

(52) U.S. Cl.
　　　CPC ......... *H01Q 21/0087* (2013.01); *H01Q 21/06* (2013.01); *H01Q 21/28* (2013.01); *H05K 9/0067* (2013.01); *H04N 5/64* (2013.01)

(56) References Cited

U.S. PATENT DOCUMENTS

| | | |
|---|---|---|
| 8,570,444 B2 | 10/2013 | Nonomura et al. |
| 2003/0085050 A1* | 5/2003 | Zarganis ............ H05K 7/20181 174/383 |
| 2010/0182206 A1* | 7/2010 | Barbieri ............... H01Q 1/2291 343/702 |
| 2011/0006953 A1 | 1/2011 | Chiang et al. |
| 2013/0063895 A1* | 3/2013 | Ritter ...................... H01L 23/36 361/692 |
| 2013/0155949 A1 | 6/2013 | Pochop, Jr. et al. |
| 2013/0169490 A1 | 7/2013 | Pascolini et al. |
| 2013/0214986 A1 | 8/2013 | Zhu et al. |

\* cited by examiner

COMPACT WIRELESS ANTENNAE MOUNTING WITH ELECTROSTATIC DISCHARGE PROTECTION

This application claims the benefit, under 35 U.S.C. § 365 of International Application PCT/US2014/061692 filed Oct. 22, 2014, which was published in accordance with PCT Article 21(2) on Apr. 30, 2015 in English and which claims the benefit of U.S. provisional application Ser. No. 61/894,985, filed Oct. 24, 2013, and of U.S. provisional application 62/009,538, filed Jun. 9, 2014.

CROSS-REFERENCE TO RELATED APPLICATIONS

This application claims the benefit of U.S. Provisional Application Ser. No. 61/894,985, filed Oct. 24, 2013 and U.S. Provisional Application Ser. No. 62/009,538, filed Jun. 9, 2014, which is incorporated by reference herein in its entirety.

FIELD OF THE INVENTION

The present principles relate generally to electronic devices and, more particularly, to electronic devices with at least one wireless antenna.

BACKGROUND OF THE INVENTION

Consumer/market preference for set top boxes and the like (such as computers, game consoles, DVD players, CD players, etc.) is to have such devices be small/compact. However, this requirement is becoming increasingly challenging, because set top boxes and the like are required to perform more functions, which require more internal components.

Wireless antennae are one key component of many set top boxes and the like. Wireless antennae for set top boxes are most often rectangular in shape and must be oriented inside the box to give the best performance possible. This means that there should be adequate clearance from metal parts in the box and that placement and orientation of antennae must be as diverse as possible within the box.

Further, to minimize the risk of electrostatic discharge associated with antennae, the major form of set top boxes were enlarged to accommodate the vertical orientation of wireless antennae.

Alternatively, when such larger sizes of the set top box or the like are not deemed acceptable to the customer's preference, antennae have been oriented horizontally. This has unfortunately reduced antennae performance. As such, the trade-off has been that smaller size boxes commensurate with a horizontally oriented antenna have been produced with non-optimal antenna performance. In short, with the consumer/market aesthetics preference for electronic devices such as set top boxes to be as small and slim as possible, horizontal form factors are often the result and required.

As such, a need exists for an antenna assembly that can function properly as an antenna, but yet meet consumer/market aesthetic requirements for a sufficiently slim electronic device in which there is a reduced propensity for electrostatic discharge.

SUMMARY OF THE INVENTION

An electronic device is provided that comprises: a vertically oriented front wall (16); a first side wall (17A) connected to a first end of the front wall to form a first corner; a second side wall (17B) connected to a second end of the front wall to form a second corner; a first antenna assembly (15H, 15V) positioned inside the electronic device adjacent to the first corner; a second antenna assembly (15H, 15V) positioned inside the electronic device adjacent to the second corner; and a circuit board (5) having a peripheral edge, wherein the antenna assemblies are positioned outside the peripheral edge. The first and the second antenna assemblies each can comprise an elongated planar antenna body having a major axis and a minor axis, wherein the major axis of each of the elongated planar antenna bodies of the first and the second antenna assemblies can be oriented vertically or horizontally. The elongated planar antenna body of the first antenna assembly can be oriented perpendicularly to the elongated planar antenna body of the second antenna assembly. The elongated planar antenna body of the first antenna assembly can further be oriented parallel to the vertically oriented front wall and the elongated planar antenna body of the second antenna assembly can further be oriented parallel to the first or second side wall.

In an embodiment of the invention, the electronic device can further comprise a horizontal bottom casing (2) from which the vertical front wall and the first and second side walls extend; and slots (19) formed into the horizontal bottom frame into which ends of the elongated planar antenna bodies are positioned, wherein the slots are defined by peripheral inner wall that surrounds vertically oriented sides of the ends of the elongated planar antenna bodies.

In another embodiment, the electronic device comprises: a horizontal bottom casing (2) from which the vertical front walls and the first and second side walls extend; and two pairs of U-shaped pockets (18), each of the pairs of the U-shaped pockets having vertically oriented slots that face each other, wherein at least a portion of opposing ends of each the elongated planar antenna body is positioned in the vertically oriented slots.

The electronic device in the embodiments can further comprise a heat sink (6) contacting the circuit board, wherein the heat sink has a peripheral end and the antenna assemblies are positioned outside the peripheral end. The first and the second antenna assemblies can each comprise elongated planar antenna bodies having a major axis and a minor axis and the elongated planar antenna bodies are positioned at least 20 mm from the peripheral end of the heat sink and the peripheral edge of the printed circuit board. The heat sink can substantially follow the lateral outline of the circuit board.

The electronic devices in the embodiments can further comprise vents (14). The vent can be formed on the first and second side walls beyond the respective lateral depths of the respective antenna assemblies of the respective side walls. Vents (14) can also be in the horizontal bottom casing in lateral positions outside the lateral positions of the antenna assemblies.

The electronic device in the embodiments can comprise dummy vents in the horizontal bottom casing and at least in one of the first or second side walls adjacent the antenna assemblies.

BRIEF DESCRIPTION OF THE DRAWINGS

The invention will be explained in greater detail in the following with reference to embodiments, referring to the appended drawings, in which.

DETAILED DESCRIPTION OF THE INVENTION

The invention is directed to electronics devices such as set top boxes and the like which include antennae such as the set top box is shown in FIGS. 8A and 8B. FIGS. 8A and 8B are disassembled views of an electronic device 1 showing a variety of features that can be included in the electronic device 1 according the invention. As illustrated in the figures, a main circuit board 5 can be housed within a top cover 7 of the device. A thermal barrier (not shown) can be positioned between the circuit board 5 and a bottom frame 2. Alternatively, the circuit board 5 can be considered a circuit board assembly 5 having a thermal barrier attached thereto. A smart card reader (not shown) can be connected to the circuit board 5 through an aperture in the thermal barrier. The device 1 can have internal components such as the smart card reader, the thermal barrier, and a top heat sink 6 contact the circuit board 5 in which the circuit board 5 and the internal components are positioned between a bottom frame 2 and the top cover 7. The device can further include a bottom heat sink 6a under the circuit board 5. Either or both heat sinks can include vertical fins at either opposing ends to promote heat dissipation. The thermal barrier can includes a thermal insulating material that preferably has substantially the same profile as the circuit board 5 or a profile that is at least 80% of the area profile of the circuit board 5. The thermal barrier keeps the smart card reader and other components under the circuit board 5 from overheating, in part, by preventing heat from transferring from the circuit board 5 and the components thereon.

It should be noted that the heat management system of the device according to embodiments of the invention can be a very important feature of the invention, especially when one needs to reduce the size of the electronic device. As such, the heat management system can advantageously work in concert with the antennae design disclosed herein. The reason is reducing the size of the housing in such devices disadvantageously concentrates the internal components and can cause detrimental overheating. As such, the heat sink 6 can be advantageously employed to provide a heat dissipating feature that efficiently removes heat from the circuit board 5. The heat sink 6 can have a top plan profile that completely covers the circuit board 5 or substantially covers the circuit board 5 such that at least 80% of the circuit board 5 is covered. The heat sink 6 can include a thermal contact pad. The heat sink 6 is a contoured plate that has a generally planar periphery and a recessed feature such as a central depression into a plane of the planar periphery, wherein the planar periphery preferably surrounds the central depression. The central depression has side walls extending from the planar periphery and forming an obtuse angle therewith. The central depression has a flat bottom that is designed to contact the circuit board 5, the heat generating components on the circuit board 5, and/or the thermal pad.

Figure 8:
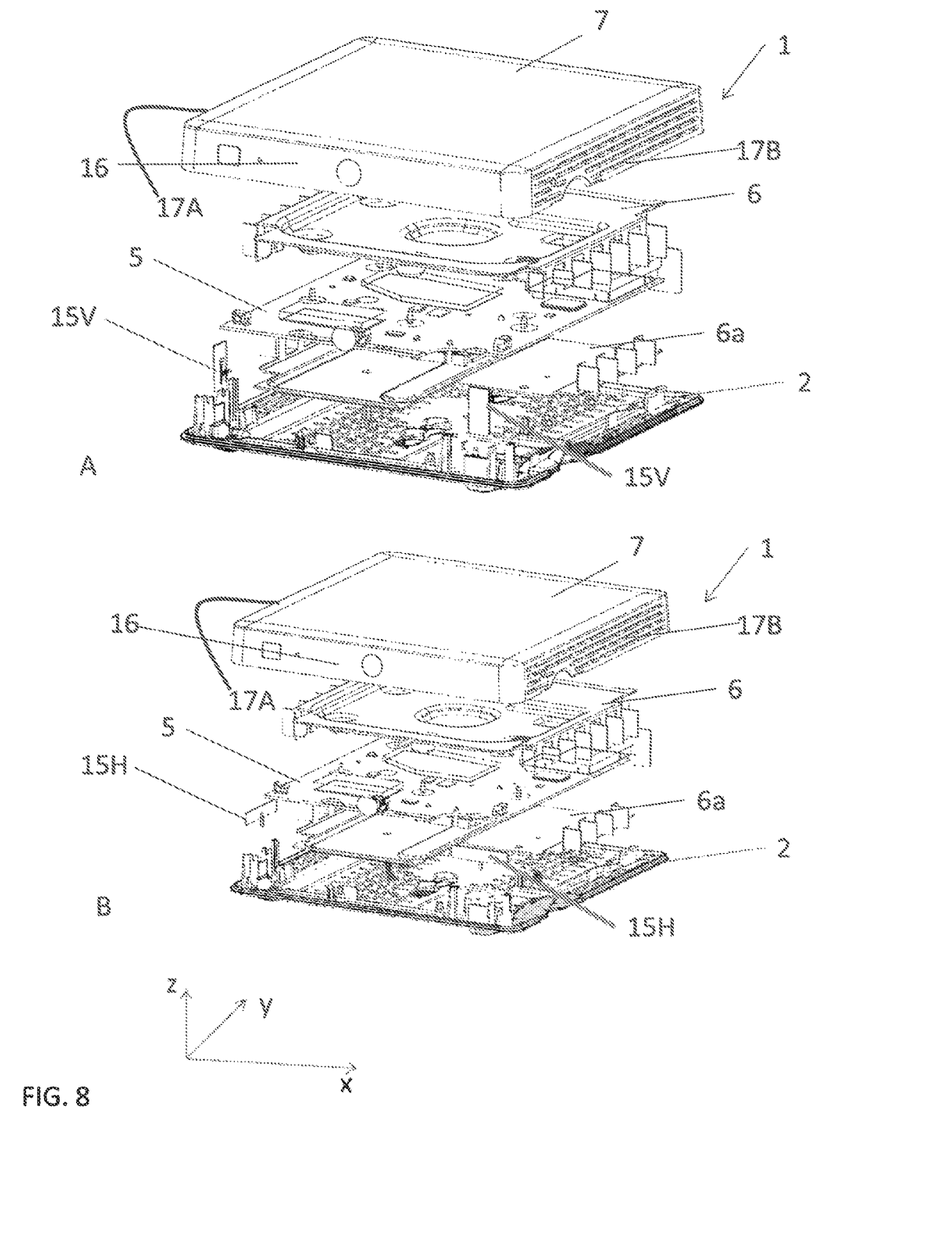
FIG. 8 shows disassembled perspective views of the set top box according to the invention.

FIGS. 8A and 8B further shows that the electronic device 1 including two separate antenna assemblies which can work in concert to optimize the transmission/reception angles. One antenna assembly 15V, 15H (in which "V" denotes a vertical orientation and "H" denotes a horizontal orientation) can be at the corner of the left side wall 17A and the front wall 16 and the other antenna assembly 5 can be at the corner of the right side wall 17B and the front wall 16. The planar broad surfaces of the antenna assemblies can be oriented perpendicular to each other to enhance transmission/reception angles. Ideally, the two antennae shown in FIG. 8 are perpendicular to each other, but their orientations can be parallel to one another and each of the antennae can also be rotated 90 degrees so that the antenna on the left is parallel to the front wall 16 and the antenna on the right is parallel to the right front wall 17b. FIG. 8A shows a vertical orientation of the antennae 15V and FIG. 8B shows a horizontal orientation of the antennae 15H.

Figure 1:
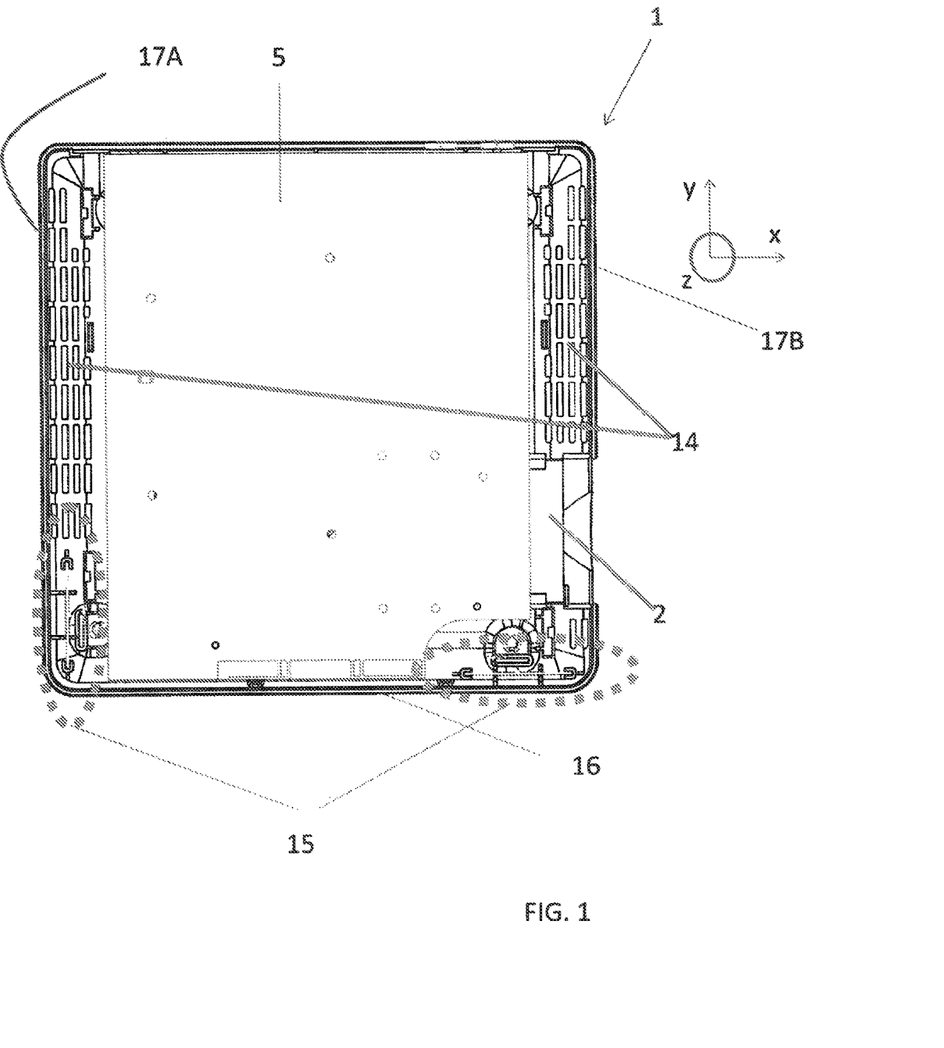
FIG. 1 is a top interior plan view of the set top box according to the invention.

FIG. 1 highlights the positioning of the antenna assemblies 15. A key point regarding proper antenna performance is that the antenna assemblies 15 should be clear of metal components. This is ensured by having the antenna assemblies 15 being positioned outside the periphery of the printed circuit board 5. Ideally, no part of the antenna assemblies should be within 20 mm of metal components; as such, no part of the antenna assemblies 15 should be within 20 mm of printed circuit board, because the main printed circuit board 5 can include metal components thereon. This figure further shows that the electronic device can include two separate antenna assemblies which can work in concert to optimize the transmission/reception angles: one antenna assembly 15 can be at the corner of the left side wall 17A and the front wall 16 and the other antenna assembly 15 can be at the corner of the right side wall 17B and the front wall 16. The planar broad surfaces of the antenna assemblies can be oriented perpendicular to each other to enhance transmission/reception angles. In this drawing, both the horizontal and vertical antenna types are shown, but in operation one or the other is employed. The vents 14 shown in FIG. 1 can be a key part of the heat management system of the device 1 and these vents can be positioned in the base frame 2 and outside the horizontal profile of the circuit board 5.

Figure 2:
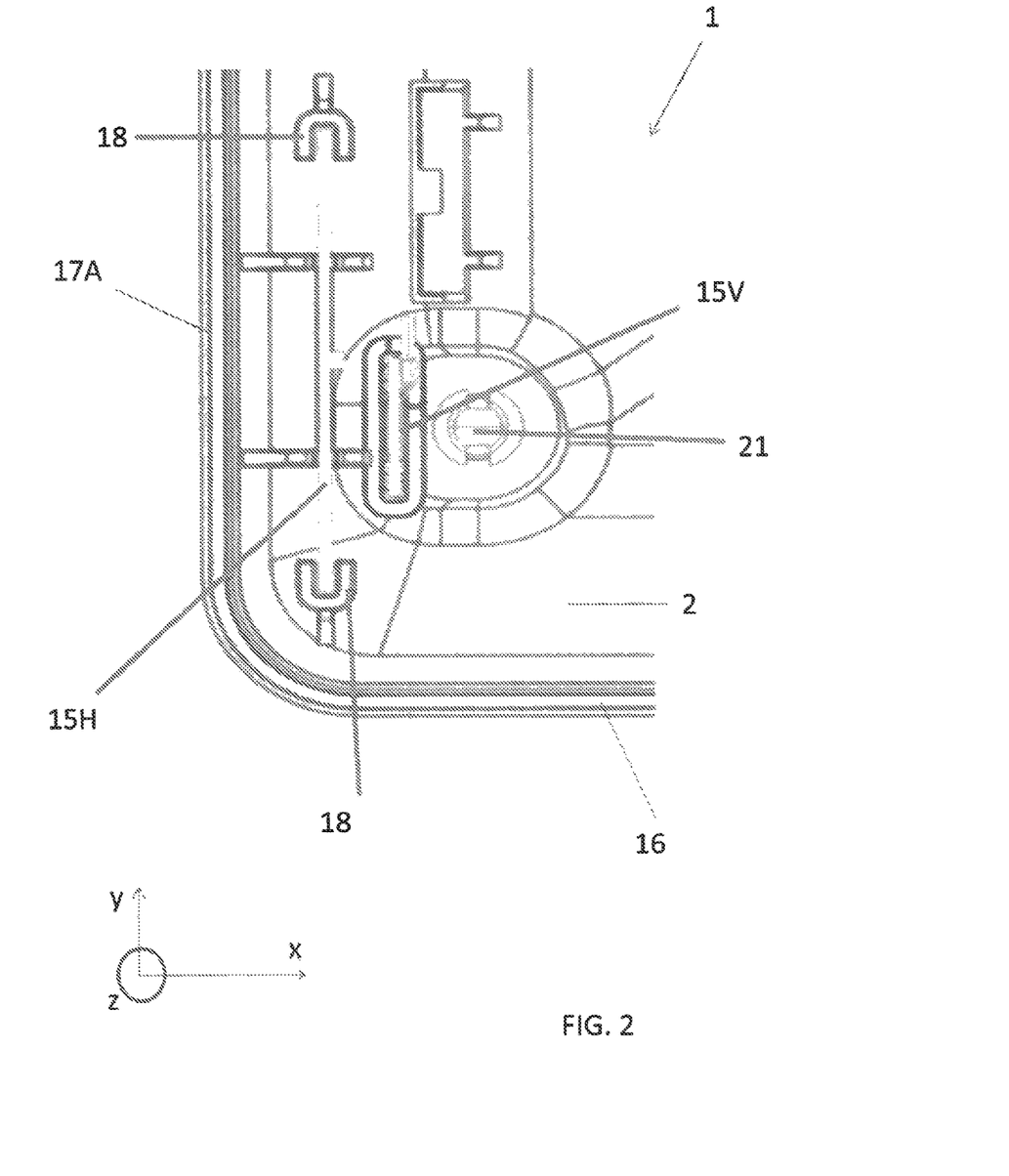
FIG. 2 is a top interior plan view of a section of the set top box according to the invention.

FIG. 2 highlights the one antenna assembly 15 at the corner of the left side wall 17A and the front wall 16. This view also shows that the antenna assemblies 15H, 15V according to the invention can have either a horizontal orientation in which the long axis of the rectangular antenna assembly runs horizontally (along the X-Y plane) or can have either have a vertical orientation in which the short axis of the rectangular antenna assembly runs horizontally (along the X-Y plane). In the horizontal orientation, the antenna assemblies 15H can be held by a pair of U-shaped pockets 18 with vertically oriented slots that face each other in which the vertical edges of the antenna assemblies 15H are held by the slots.

Figure 3:
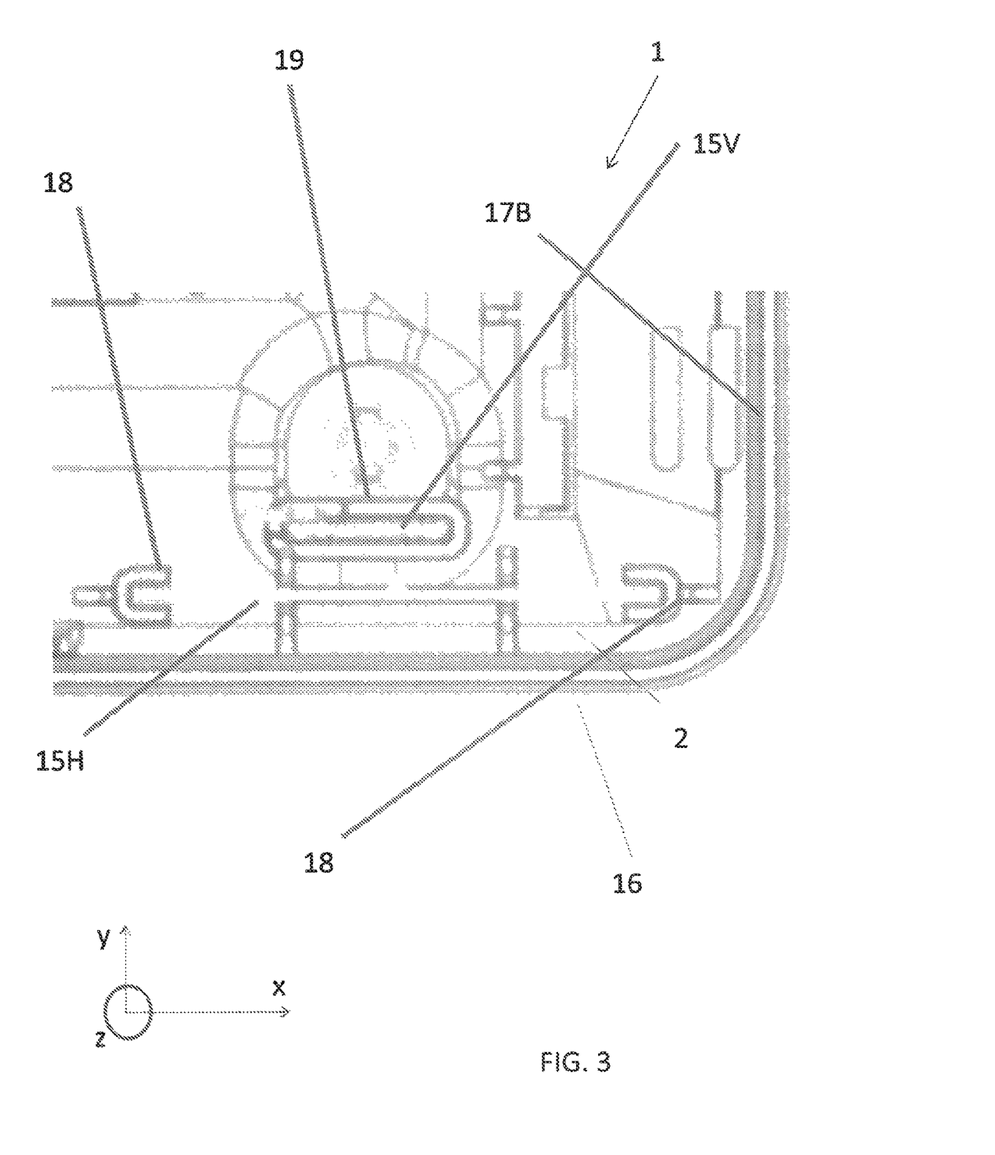
FIG. 3 is a top interior plan view of another section of the set top box according to the invention.

FIG. 3 highlights the one antenna assembly 15 at the corner of the right side wall 17B and the front wall 16. This view also shows that the antenna assemblies 15H, 15V according to the invention can have either have a horizontal orientation in which the long axis of the rectangular antenna assembly runs horizontally (along the X-Y plane and the short axis is vertical) or can have a vertical orientation in which the short axis of the rectangular antenna assembly runs horizontally (along the X-Y plane and the long axis is vertical). In the vertical orientation the antenna assemblies 15V can be held by a slot 19 that has a horizontal profile in the X-Y plane that matches the edge profile of the antenna assemblies 15V to hold the antenna assemblies 15V securely when the antenna assemblies 15V is slid into the slot 19.

FIGS. 2 and 3 also show possible rubber foot 21 mounting location. These locations can be in the vicinity of the antenna assembly or these locations can overlap with the antenna assembly mounted in the bottom frame 2.

Figure 4:
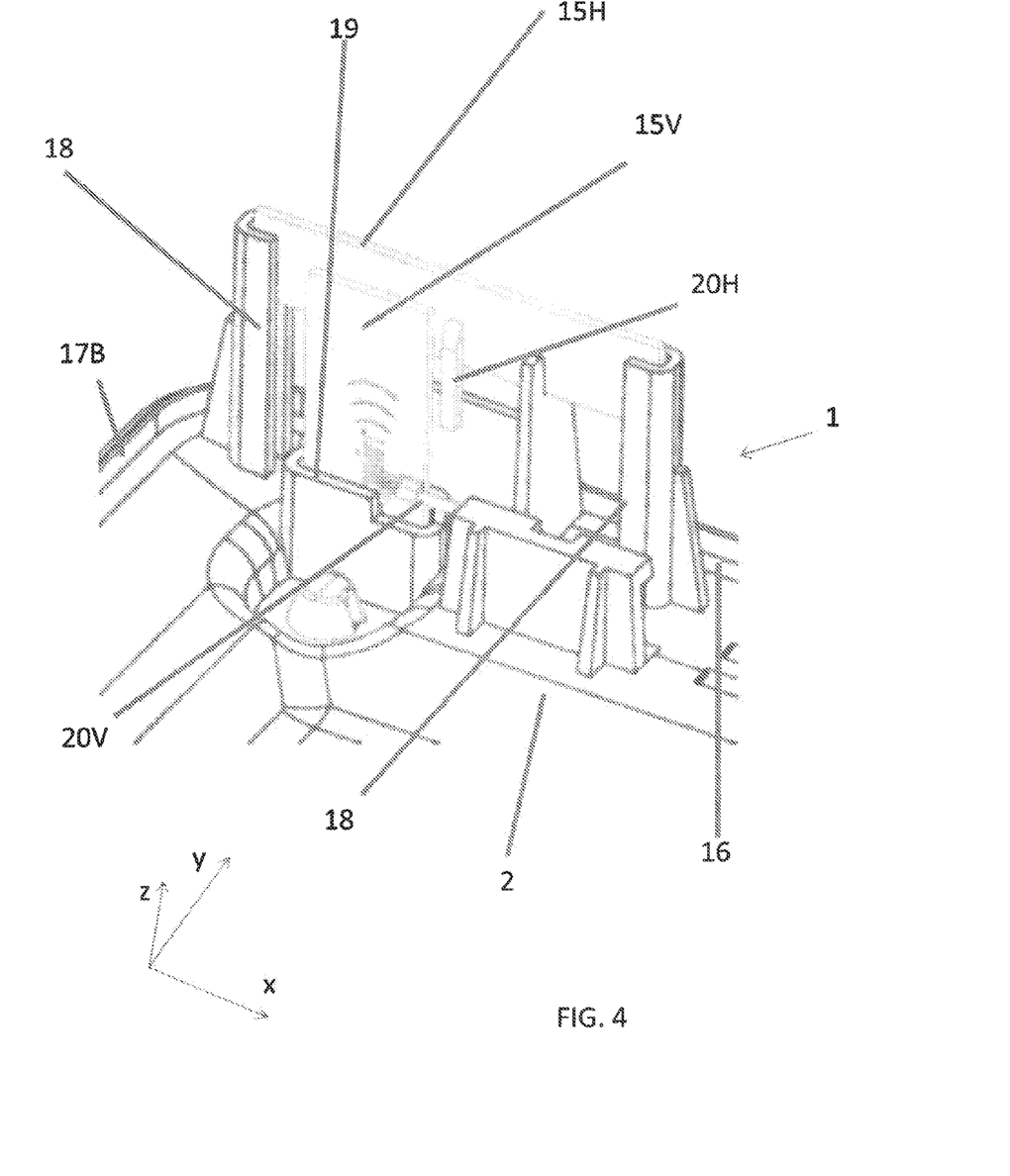
FIG. 4 is an interior perspective view of a section of the set top box according to the invention.

FIG. 4 is a perspective view of the one antenna assembly 15 at the corner of the right side wall 17B and the front wall 16. This view more clearly shows how the antenna assemblies 15H, 15V according to the invention can have either a horizontal orientation or a vertical orientation and also show how the assemblies 15H, 15V are supported in the set top box. The antenna assemblies 15 can be supported by a slot 19 or by a pair of U-shaped pockets 18 with vertically oriented slots that face each other in which the vertical edges of the antenna assemblies 15H are held by the slots. In either case, the antenna assembly 15 can include a connector 20V, 20H and extends to an electrical connection component either underneath the antenna assembly or to the side of the antenna assembly. It should be pointed out the assembly 15H could alternatively be supported by a slot 19 and the assembly 15V could alternatively be supported by U-shaped pockets 18.

Figure 5:
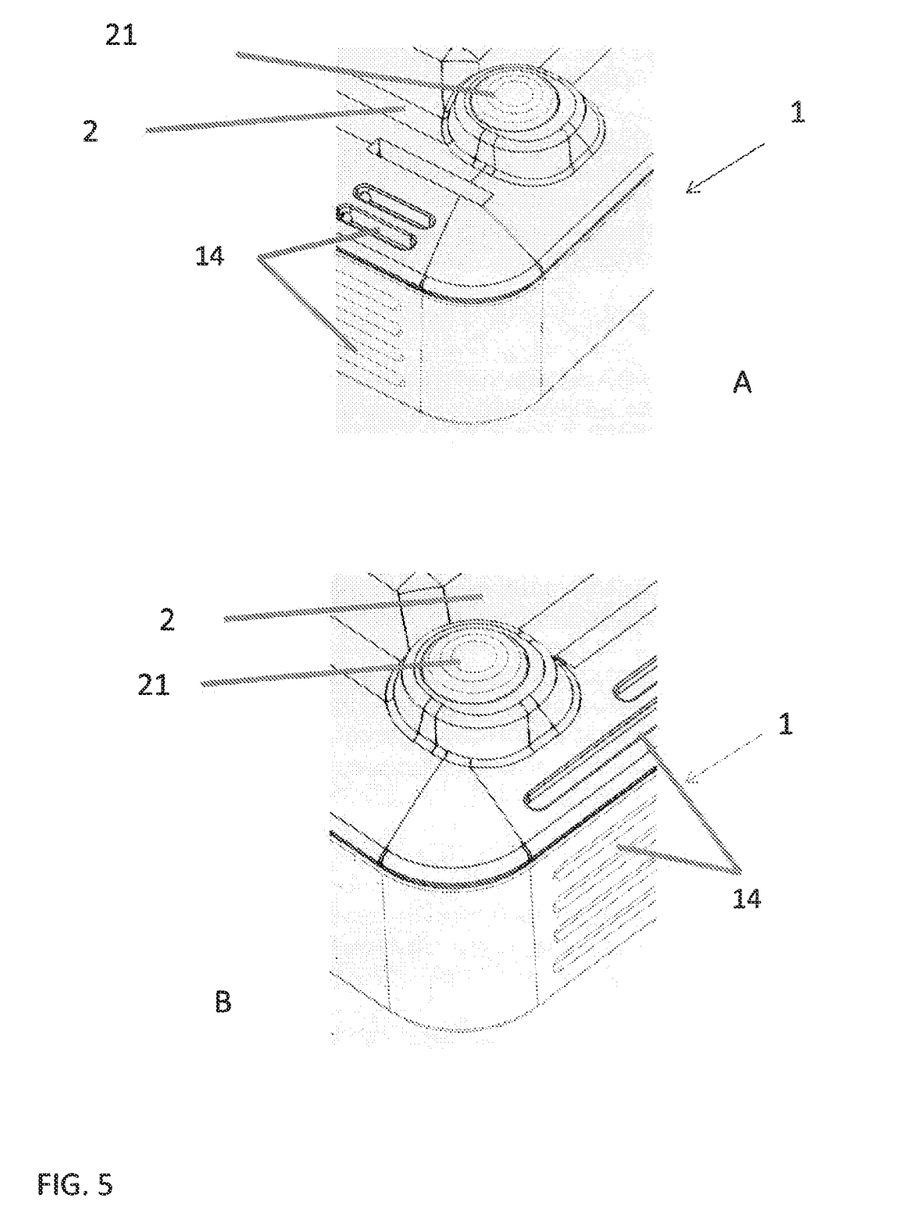
FIG. 5 shows bottom exterior perspective views of sections of the set top box according to the invention.

FIGS. 5A and 5B are a perspective bottom views of the set top box showing some of the heat dissipation vents or vent impressions 14 on the bottom frame 2 and on the side walls 17 in the vicinity of the antenna assemblies 15. In the vicinity of the antennae, these vents are "closed blind" to protect against electrostatic discharge and yet still maintain consistency in the aesthetic pattern of vents. ("Closed blind" means that there is an appearance of a vent for the aesthetic purposes but there is actually no vent or opening association with this feature.) These views also show the feet 21 in the bottom frame 2 which can be important to appropriately elevate the set top box on the supporting surface at a sufficient height to permit adequate heat dissipation by convection of air.

Figure 6:
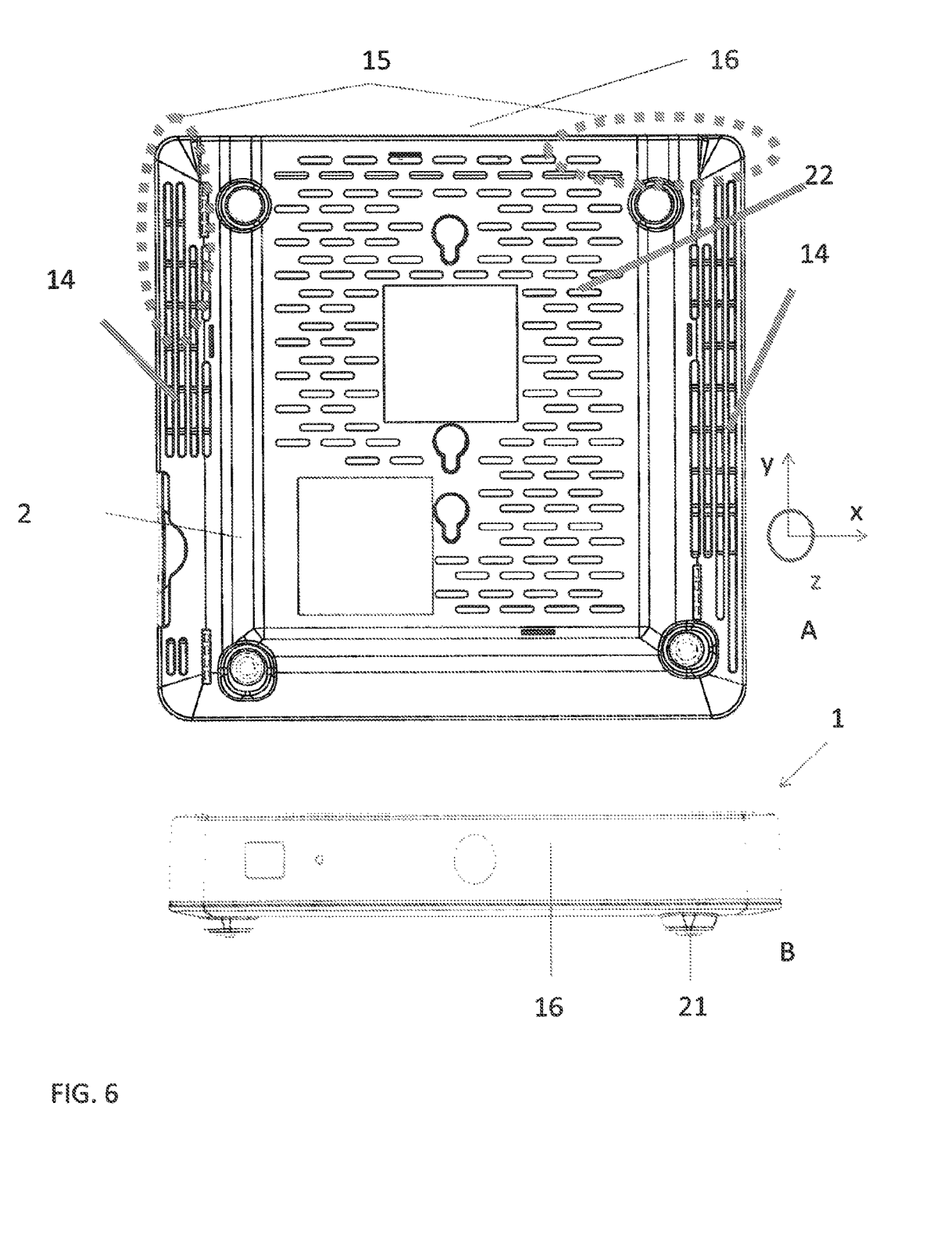
FIG. 6 shows exterior plan views of the set top box according to the invention.

FIGS. 6A and 6B show a bottom plan view and a front plan view of the set top box according to the invention. respectively. FIG. 6A shows a preferred pattern of the heat dissipation vents or vent impressions 14 on the bottom frame 2 in the vicinity of the antennae assemblies 15 and neighboring areas along the side of the set top box. In the vicinity of the antennae, these vents are closed blind to protect against electrostatic discharge and yet still maintain consistency in the aesthetic pattern of vents. Closed blind vents can be referred to as dummy vents. The vents outside the antenna assembly region can be open to assist with heat removal or dissipation. FIG. 6A show other heat dissipation vents 22 in the bottom frame 2 in the vicinity of or underneath the main printed circuit board 5. FIG. 6B shows a plan front view of the electronic device and the feet 21 thereon, which shows front wall 16.

Figure 7:
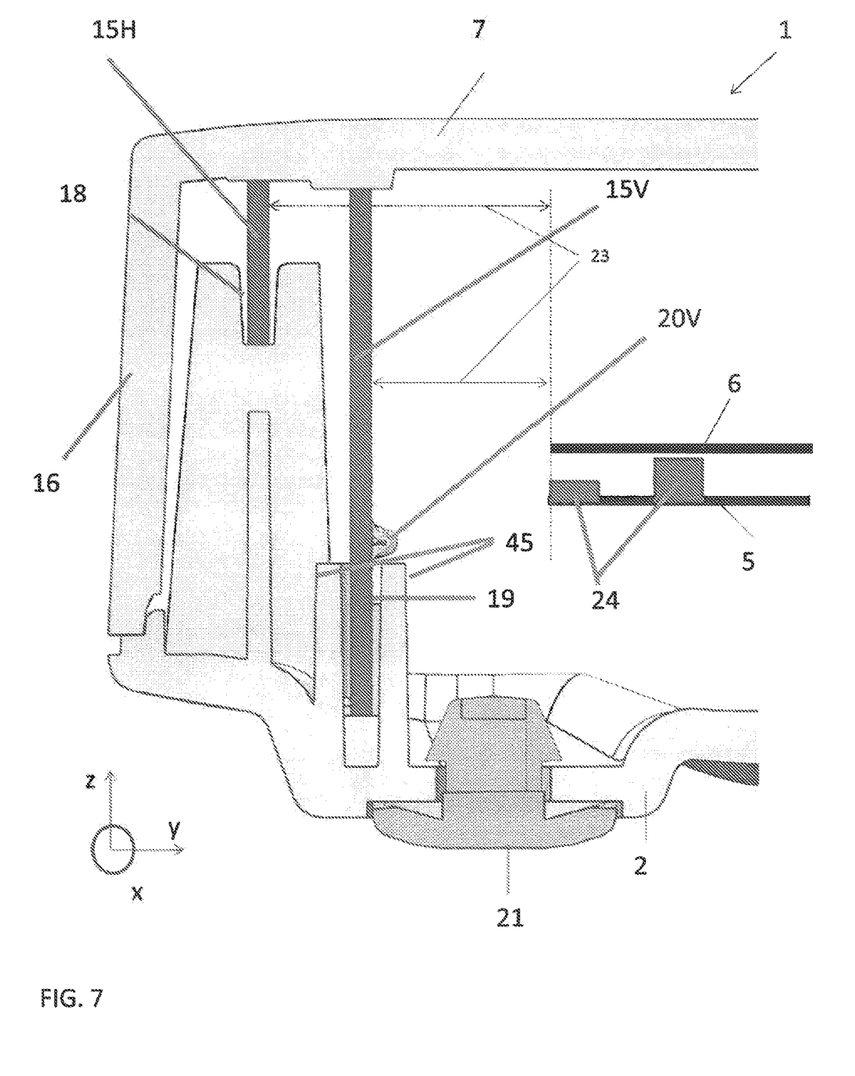
FIG. 7 is an interior sectional view of a section of the set top box according to the invention.

FIG. 7 is a cross sectional interior view of the set top box. This view shows the feature of having a lateral dimension or spacing 23 between the antennae assemblies and metal components such as a heat sink 6. This view shows that the lateral dimension or spacing 23 can also be between the antennae assemblies and the main printed circuit board 5 and/or metal components 24 thereon. It is preferable that the lateral dimension or spacing 23 exceed about 20 mm to create sufficient electrostatic discharge isolation regions or pockets. Here, the slots 18 and 19 which hold the antennae assemblies 15H and 15V can be non-metallic or plastic to prevent electrostatic discharge and can shield the antenna from openings such as the feet openings in the bottom frame 2 through which feet 21 are placed.

In sum, a feature of the invention is that the antenna assemblies should be clear of metal components. This can be ensured by having the antenna assemblies being positioned outside the periphery of the printed circuit board. Ideally, no part of the antenna assemblies should be within 20 mm of metal components; as such, no part of the antenna assemblies should be within 20 mm of printed circuit board, because the main printed circuit board can include metal components thereon.

When operational performance of the antennae are deemed more important, mounting the rectangular antennae so that the long axis is oriented vertically is often required for the best performance. By orienting mounting foot details on the bottom of the set top box, it is possible to position antennae in ideal antennae locations and fit the antennae vertically. This allows the major form of the set top box to be thinner than the height of the vertical antennae; however, since foot mounting locations often require a hole for mounting rubber feet, there is the chance for electrostatic discharge to reach the wireless antennae. To prevent this, the addition of walls 45 in the plastic detail create a continuous barrier around the antennae. This is all integrated into the molded details of the plastic case of the bottom frame 2. By strategically locating foot mounting locations and creating electrostatic discharge isolation pockets, wireless antennae can be mounted in small set top boxes in a manner that optimizes the performance of the wireless antennae and minimizes the size of the set top box.

In an embodiment of the invention, a thin horizontally oriented set top box is provided which can include a plastic case forms an enclosure around internal electronics such as printed circuit board (pcb) assemblies and heatsinks as shown in FIG. 8. The wireless antennae 15 can be created as separate printed circuit boards so that they can be positioned away from the main printed circuit board and heatsinks. As printed circuit board structures, the wireless antenna can be a laminated structure having an antenna layer and a board layer. The optimal locations for antennae are on the outer perimeters of the plastic case. The optimal orientations of the antennae are such that the long axis of the antennae is vertical and these antennae need to be enclosed by the case. By positioning case mounting foot locations in optimal antennae mounting locations, the vertical antennae can be mounted in the pocket created by the mounting location. This allows the major form of the case to be thinner than the height required by the antennae.

In some embodiments, the assembly of a rubber foot 21 is needed to stabilize the set top box on table top surfaces in which a hole in the mounting detail of the plastic bottom is provided to hold the rubber foot. Openings in plastic enclosures, however, are pathways for electrostatic discharge to reach internal electronics and damage components. Since the foot mounting details need to be as small as possible for aesthetics, this puts the wireless antennae close to the opening for the rubber foot 21. As such, to prevent electrostatic discharge from reaching the wireless antenna, the addition of walls in the plastic detail (which can include the U-shaped pockets 18 and/or slots 19 formed into the bottom frame 2) create a continuous barrier around the antennae. This is all integrated into the molded details of the plastic case.

It is important to note that 2 antennae locations in FIGS. 1-4 and 7 are shown for each applicable front corner with details for mounting the antennae in both horizontal and vertical orientations. This is done to show multiple possibilities of implementing the invention. However, physical testing and consumer preference with regards to form factor preference, size preference, and performance preference dictate the actual orientation to employ, which is generally only 1 antenna placed in each applicable corner. Also, it should be noted that the antennae designed for horizontal placement are longer and narrower than the antennae designed for vertical placement.

In other words, the vertical and horizontal orientations of the antennae assemblies are shown to emphasize that the invention is intended to include both types of orientations in which the set top box can be oriented either vertically or horizontally; or the invention can include the use of two antennae of both orientations in each applicable corner as shown in FIG. 7.

Figure 9:
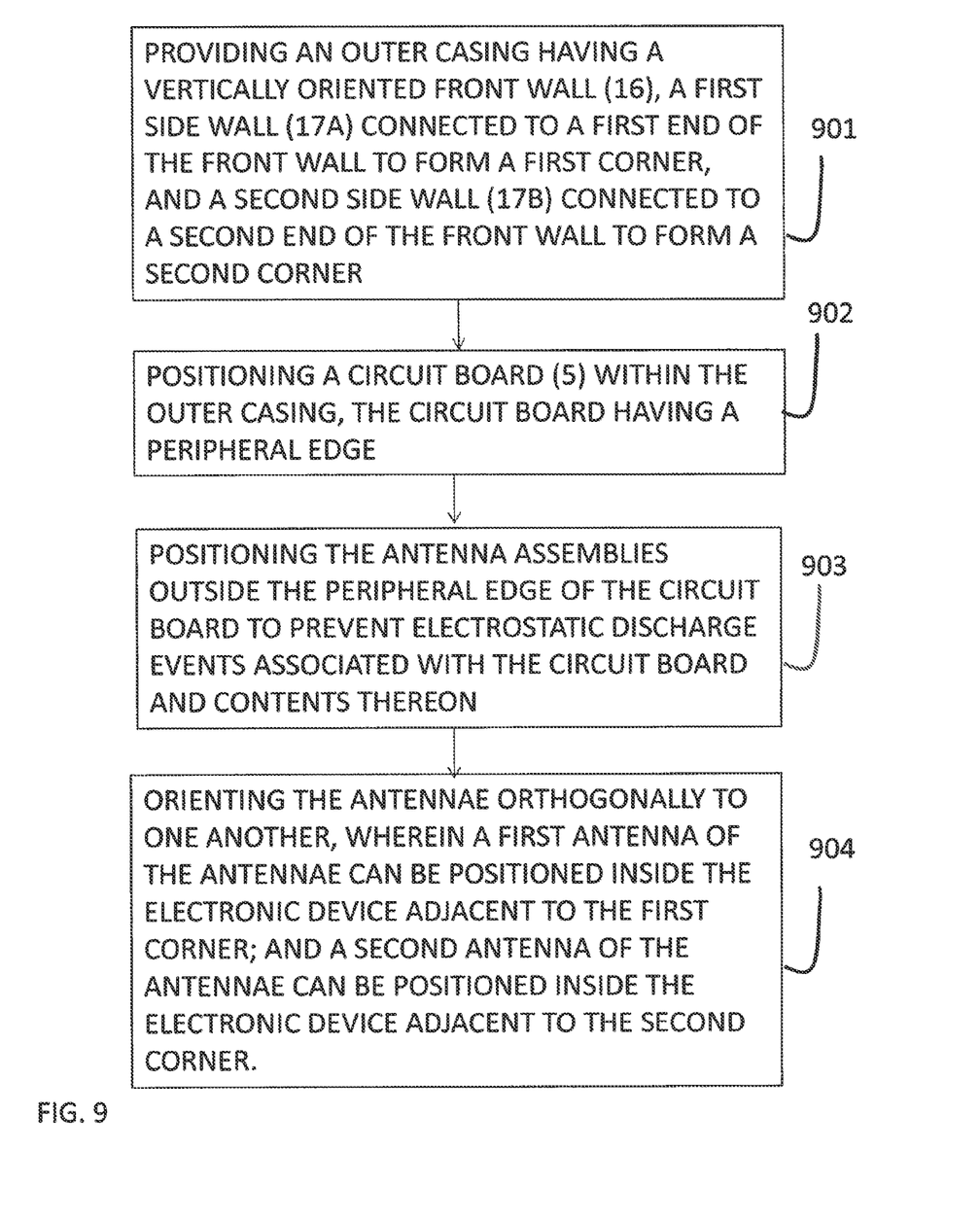
FIG. 9 is a flowchart outlining the method of assembling the electronic device according to the invention.

An aspect of the invention is shown in FIG. 9 and includes the method of assembling an electronic device having two antennae (15H, 15V) described above that comprises the steps of: providing (901) an outer casing having a vertically oriented front wall (16), a first side wall (17A) connected to a first end of the front wall to form a first corner, and a second side wall (17B) connected to a second end of the front wall to form a second corner; positioning (902) a circuit board (5) within the outer casing, the circuit board having a peripheral edge; and positioning (903) the antenna assemblies outside the peripheral edge of the circuit board to prevent electrostatic discharge events associated with the circuit board and contents thereon. The method can further include the step of orienting (904) the antennae orthogonally to one another, wherein a first antenna of the antennae can be positioned inside the electronic device adjacent to the first corner; and a second antenna of the antennae can be positioned inside the electronic device adjacent to the second corner.

The invention claimed is:

1. An electronic device comprising:
a vertically oriented front wall;
a first side wall connected to a first end of the front wall to form a first corner;
a second side wall connected to a second end of the front wall to form a second corner;
a first antenna assembly positioned inside the electronic device adjacent to the first corner, the first antenna assembly comprising a first elongated planar antenna body having a major axis, the first antenna assembly mounted in a first vertical plane with the major axis corresponding to the first vertical plane;
a second antenna assembly positioned inside the electronic device adjacent to the second corner, the second antenna assembly comprising a second elongated planar antenna body having a minor axis, the second antenna assembly mounted in a second vertical plane with the minor axis corresponding to the second vertical plane;
a circuit board having a peripheral edge, wherein the first and second antenna assemblies are positioned outside the peripheral edge; and
slots formed into a horizontal bottom frame into which ends of the first and second elongated planar antenna bodies are positioned, the slots forming a continuous barrier around the first and second elongated planar antenna bodies for electrostatic discharge protection;
wherein the first antenna assembly is oriented perpendicularly to the second antenna assembly.

2. The electronic device of claim 1 wherein the first elongated planar antenna body is oriented parallel to the vertically oriented front wall and the second elongated planar antenna body is oriented parallel to the first or second side wall.

3. The electronic device of claim 1 wherein the horizontal bottom frame connects to the vertical front wall and the first and second side walls.

4. The electronic device of claim 1 comprising:
two pairs of U-shaped pockets, each of the pairs of the U-shaped pockets having vertically oriented slots that face each other, wherein at least a portion of opposing ends of each the first and second elongated planar antenna bodies are positioned in the vertically oriented slots.

5. The electronic device of claim 1 comprising a heat sink contacting the circuit board, the heat sink having a peripheral end.

6. The electronic device of claim 1 comprising a heat sink contacting the circuit board, and wherein the first and second elongated planar antenna bodies are positioned at least 20 mm from the peripheral end of the heat sink and the peripheral edge of the printed circuit board.

7. The electronic device of claim 1 comprising vents on the first and second side walls that are only formed beyond the respective lateral depths of the respective first and second antenna assemblies of the respective side walls.

8. The electronic device of claim 1 comprising:
vents in the horizontal bottom frame in lateral positions outside lateral positions of the first and second antenna assemblies.

9. The electronic device of claim 1 comprising:
vents in the horizontal bottom frame in lateral positions outside lateral positions of the first and second elongated planar antenna bodies and outside the peripheral edge of the circuit board.

10. A method of assembling an electronic device having two antenna assemblies comprising the steps of:
providing an outer casing having a vertically oriented front wall, a first side wall connected to a first end of the front wall to form a first corner, and a second side wall connected to a second end of the front wall to form a second corner;
positioning a circuit board within the outer casing, the circuit board having a peripheral edge; and
positioning the two antenna assemblies outside the peripheral edge of the circuit board to prevent electrostatic discharge events associated with the circuit board and contents thereon, the two antenna assemblies having elongated planar antenna bodies mounted vertically in slots forming a continuous barrier around each of the elongated planar antenna bodies, wherein the two antenna assemblies are oriented perpendicularly to one another.

11. The method of claim 10 further comprising the step of orienting the two antenna assemblies orthogonally to one another such that a major axis of a first antenna is oriented vertically and a minor axis of the other antenna is oriented vertically.

12. The method of claim 10 wherein a first antenna of the two antenna assemblies is positioned inside the electronic device adjacent to the first corner; and a second antenna of the two antenna assemblies is positioned inside the electronic device adjacent to the second corner.

* * * * *